United States Patent [19]

Kuroda et al.

[11] Patent Number: 4,469,535
[45] Date of Patent: Sep. 4, 1984

[54] METHOD OF FABRICATING SEMICONDUCTOR INTEGRATED CIRCUIT DEVICES

[75] Inventors: Shigeo Kuroda, Ohme; Takahiko Takahashi, Kodaira; Akio Anzai, Tanashi, all of Japan

[73] Assignee: Hitachi, Ltd., Tokyo, Japan

[21] Appl. No.: 457,219

[22] Filed: Jan. 11, 1983

[30] Foreign Application Priority Data

Jan. 25, 1982 [JP]  Japan .................................... 57/8934

[51] Int. Cl.³ ............................................ H01L 21/22
[52] U.S. Cl. .................................... 148/187; 29/578; 29/577 C; 29/576 B
[58] Field of Search ................. 29/578, 577 C, 576 B; 148/187

[56] References Cited

U.S. PATENT DOCUMENTS

| | | | |
|---|---|---|---|
| 3,992,232 | 11/1976 | Kaji et al. | 148/175 |
| 4,111,724 | 9/1978 | Ogiue et al. | 148/187 X |
| 4,376,664 | 3/1983 | Hataishi | 148/175 |
| 4,378,260 | 3/1983 | Fukuda et al. | 148/187 |
| 4,380,480 | 4/1983 | Shimbo | 148/187 |

FOREIGN PATENT DOCUMENTS

| | | |
|---|---|---|
| 2951504 | 6/1980 | Fed. Rep. of Germany . |
| 3014363 | 6/1980 | Fed. Rep. of Germany . |
| 05164 | 11/1979 | European Pat Off. . |
| WO80/20144 | 12/1980 | PCT Int'l Appl. . |
| 1457169 | 12/1976 | United Kingdom . |
| 1457139 | 12/1976 | United Kingdom . |
| 1492447 | 11/1977 | United Kingdom . |
| 1580657 | 12/1980 | United Kingdom . |
| 2090467 | 7/1982 | United Kingdom . |

Primary Examiner—G. Ozaki
Attorney, Agent, or Firm—Antonelli, Terry & Wands

[57] ABSTRACT

A method of fabricating semiconductor integrated circuit devices having a semiconductor region in a position separated by a predetermined distance from a dielectric isolating region provided on the surface of a semiconductor wafer, comprising the steps of forming a first mask to define the dielectric isolating region and semiconductor region, forming a second mask over the first mask so as to cover the region which is to become the semiconductor region, and removing the second mask after the dielectric isolating region has been formed by the first and second masks, to form the semiconductor region. The method thus permits the semiconductor region to be self-aligned with the dielectric isolating region.

4 Claims, 16 Drawing Figures

METHOD OF FABRICATING SEMICONDUCTOR INTEGRATED CIRCUIT DEVICES

BACKGROUND OF THE INVENTION

This invention relates to a method of fabricating semiconductor integrated circuit devices, and, more particularly, to techniques for self-aligning an isolating region in a semiconductor integrated circuit device with semiconductor regions formed on islands (active regions) surrounded by the isolating region.

Among the isolation methods for forming a plurality of dielectrically isolated islands, on which circuit elements are to be formed, on a silicon semiconductor body in a bipolar type integrated circuit device, the oxide isolation method is widely used. In the oxide isolation method, an oxidation impermeable mask consisting of silicon nitride film is formed to cover the parts of a semiconductor body which are to become islands, and the semiconductor body is then exposed to an oxidizing atmosphere to form a thick oxide film (field oxide film), which constitutes the isolating region.

The oxide isolation method has a disadvantage in that a part of the thick isolation oxide film over the surface of each island projects like a bird's beak. Accordingly, when impurities are diffused into an island by using as a mask a thick oxide film that has a bird's beak to form a PN junction such as a collector-base junction, the part of the PN junction which is located at a boundary between the thick oxide film and the island is covered with a thinner oxide film in the shape of the bird's beak. Consequently, when the resultant product is subjected to an oxide film-removing step, for example, a washing step, after a first PN junction has been formed, a part of the thin oxide film in the shape of the bird's beak is removed, so that the PN junction formed by using the bird beak part as a mask is uncovered from the oxide film or is nearly uncovered. As a result, when a second type of impurity is then introduced into, or when an electrode is then formed on, the resultant product by utilizing the thick oxide film as part of a mask, the initially-formed PN junction is short-circuited.

In a conventional technique for forming a bipolar transistor by using the oxide isolation methid, the base diffusion is carried out by utilizing an oxide isolation film having a bird's beak as a mask. However, the emitter diffusion, which is carried out by utilizing the oxide isolation mask, it not employed in the next step since it is liable to cause a short-circuit between the emitter and collector. The step of forming a so-called walled emitter structure by carrying out the diffusion of an emitter region with an oxide isolation film utilized as part of a mask is not employed. In fact, an emitter region is formed in the central part of an island, which is separated from the isolation oxide film by a predetermined distance. In order to form an emitter region in a position separated from a bird's beak, it is necessary to determine the distance between the dielectric isolating region and the emitter-forming region, taking into consideration any errors occurring in the alignment of the mask for the emitter-forming region with that for the dielectric isolating region. Mask-alignment errors cannot be ignored in the current mask-alignment techniques. Accordingly, it is necessary that the area of the semiconductor body which is used to form transistors thereon is increased. The above problems will be described hereinafter with reference to the drawings so as to make the problems easier to understand.

As shown in FIGS. 1A and 1B, a thick oxide film (field oxide film) 4, which is formed by thermally oxidizing a semiconductor body 1, is used as a dielectric isolating region in each semiconductor region. It is necessary in this case that no so-called "walled emitter structures," in which the field oxide film 4 and an emitter region 7 overlap each other, are formed. The reasons why the formation of a walled emitter structure should be avoided are as follows:

If a walled emitter structure is formed, short-circuiting could occur between an emitter and a collector as mentioned above, and a sufficiently high breakdown voltage between adjacent transistor elements cannot be obtained.

In order to prevent a walled emitter structure from being formed, it is necessary to leave a mask-alignment margin to allow for any errors occurring in the alignment of the mask defining the field oxide film 4 with the mask defining the emitter region 7. For example, if the distance $d_1$, by which the field oxide film 4 and emitter region 7 shown in FIG. 1A should be separated, must be 3 $\mu$m, the distance $d_1$ is made 4.5 $\mu$m in practice, to include a margin corresponding to an error of ±1.5 $\mu$m occurring in the alignment of the masks, to secure the required distance of 3 $\mu$m irrespective of the degree of mask-alignment error.

When a mask-alignment margin is left in the above manner, any short-circuiting, which could occur due to a walled emitter structure forming, can be prevented. However, on the other hand, leaving a margin in such a manner raises the following problems.

Providing a mask-alignment margin between the field oxide film 4 and the emitter region 7 causes an increase in the area of the base region and an increase in the area of a base-collector junction as may be clearly understood from the drawings. Thus, leaving a mask-alignment margin prevents an increase in the degree of integration of the semiconductor integrated circuit device, and causes an increase in the collector-base junction capacitance, which inhibits the high-speed operation of a semiconductor integrated device. The above results have given rise to some problems as the techniques for increasing the degree of integration and the speed of operation of ICs has advanced in recent years.

SUMMARY OF THE INVENTION

An object of the present invention is to provide a method of fabricating ICs which increases the degree of integration and the speed of operation of the ICs.

The method according to the present invention includes the steps of forming a first mask, which defines at the same time an isolating region and a semiconductor region constituting a circuit element in an island, and forming a second mask in such a manner that the semiconductor region defined by the first mask is covered by the second mask, the dielectric isolating region being formed by utilizing the first and second masks together. The dielectric isolating region is, thus, self-aligned with the island, in which the semiconductor region is to be formed.

The above and other objects as well as the advantages of the invention will become apparent from the following description of preferred embodiments taken in conjunction with the accompanying drawings.

BRIEF DESCRIPTION OF THE DRAWINGS

FIGS. 2A–2I are sectional views illustrating the steps of fabricating a bipolar IC according to the present invention;

DESCRIPTION OF THE PREFERRED EMBODIMENTS

FIGS. 2A–2I are sectional views illustrating the steps of fabricating a bipolar IC according to the present invention.

Figure 1A:
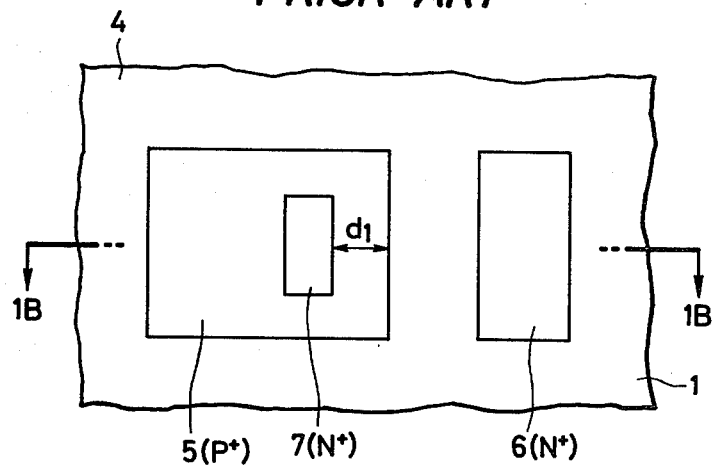
FIGS. 1A and 1B are a plan view and a sectional view, respectively, illustrating the construction of a transistor in a bipolar IC, which is formed by a conventional oxide isolation method.
Figure 1B:
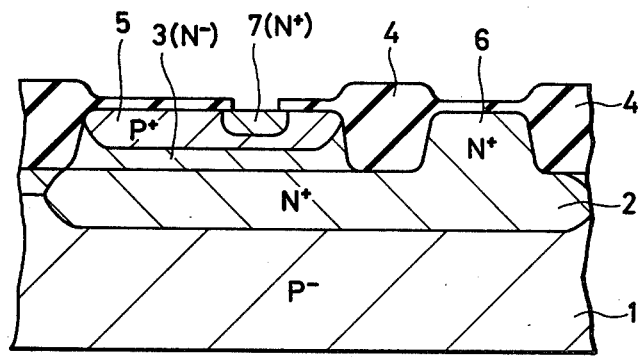
Figure 2A:
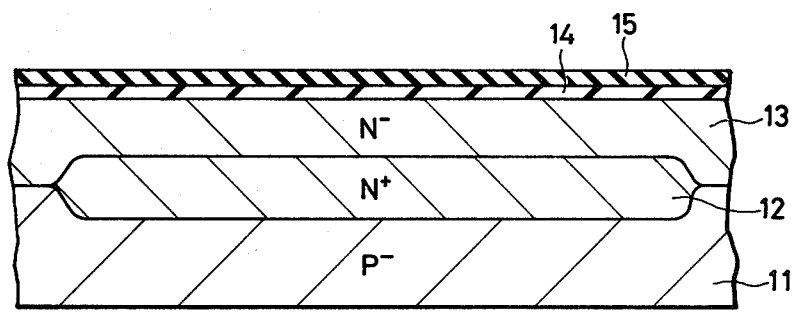

First, as shown in FIG. 2A, a N type impurity, for example, antimony (Sb) is selectively diffused into a main surface of a P− type silicon substrate 11 to form a N+ type buried layer 12, and a N− type silicon layer 13 is then formed on the buried layer 12 by epitaxial growth. After such a semiconductor body has been prepared, the surface of the N− layer 13 thereof is thermally oxidized to form a thin (200–500 Å) silicon oxide film ($SiO_2$ film) 14, and a silicon nitride film ($Si_3N_4$ film) 15, an oxidation impermeable film (anti-oxidation film), is formed thereon to a thickness of about 1000–1500 Å by the chemical vapor deposition method (CVD method).

Figure 2B:
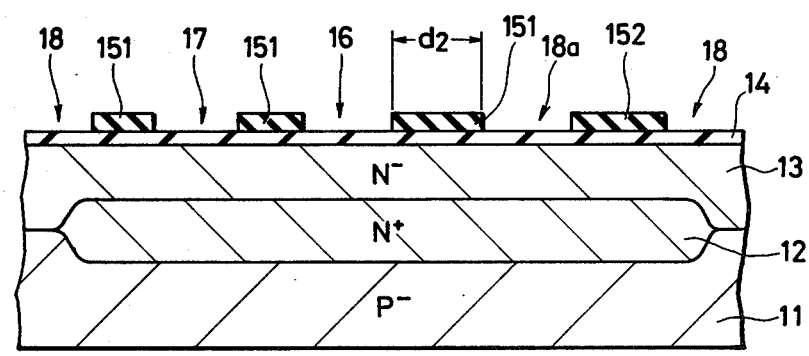
Figure 3A:
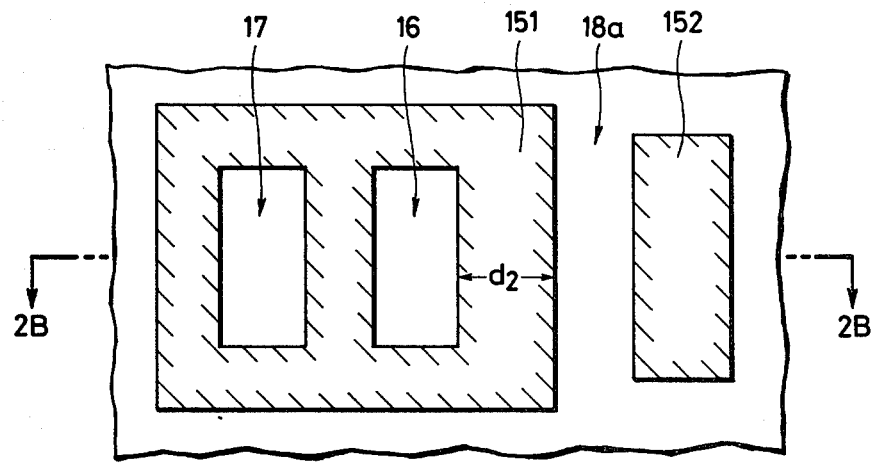
FIGS. 3A and 3B are plan views illustrating the IC-fabricating steps shown in FIGS. 2A–2I.

Next, as shown in FIG. 2B, the $Si_3N_4$ film 15 is patterned by subjecting it to a conventional photo-etching method to form a first oxidation impermeable mask having masking areas 151, 152. These masking areas 151, 152 are shaped as shown in FIG. 3A. The masking area 151 covers a section which is to become a base region, and which is separate from section 16 which will become an emitter region, and a base electrode contact section 17. The masking area 152 covers a collector electrode contact section. The sections at which the $SiO_2$ film is exposed are the section 16 which will become the emitter region, the base electrode contact section 17, and sections 18, 18a which will be covered by field oxides films. In this structure, the distance $d_2$ between the section 16 which will be the emitter and the section 18a which will be covered by a field oxide film is set to 3 μm, for example. The distance $d_2$ does not include any mask-alignment margin, and the emitter region and the field oxide film are formed while they are kept separated by substantially 3 μm.

Figure 2C:
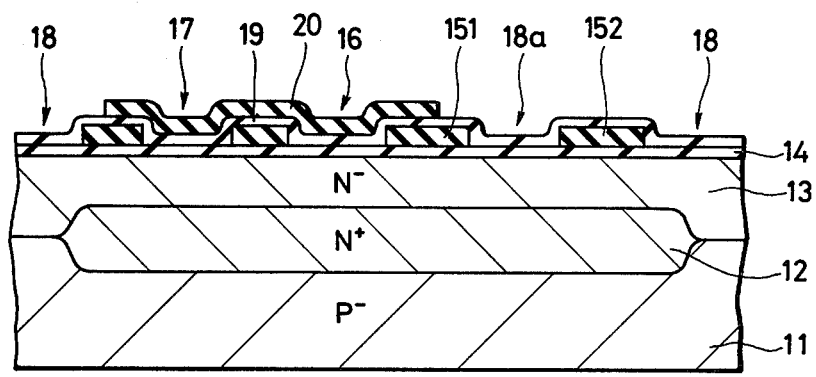
Figure 3B:
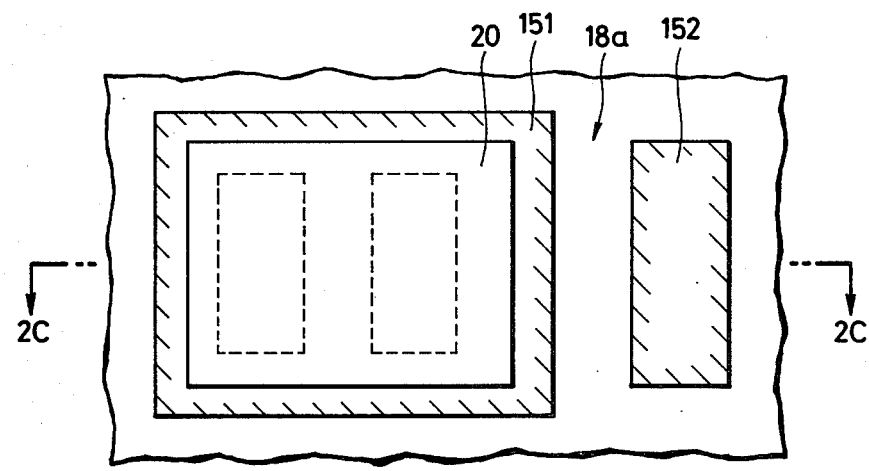

As shown in FIG. 2C, a $SiO_2$ film 19 is then formed to a thickness of about 200–500 Å by the CVD method on the whole surface of the resultant semiconductor body, and a $Si_3N_4$ oxidation impermeable film, is thereafter formed thereon by the CVD method. The $Si_3N_4$ is subjected to selective etching to partially remove the same, forming a second oxidation impermeable mask 20 covering the section 16, which will become the emitter region, and the base electrode contact section 17. The second oxidation impermeable mask 20 is shaped as shown in FIG. 3B. When the materials of the first and second masks are not the same, the $SiO_2$ film 19 need not be formed. During the patterning of the $Si_3N_4$ film 20, the first oxidation impermeable film may be formed in such a manner that the section 16 that will become the emitter, and the base electrode contact section 17 are sufficiently covered therewith, and it is not strictly necessary that the first and second oxidation impermeable masks be aligned to a high accuracy.

Figure 2D:
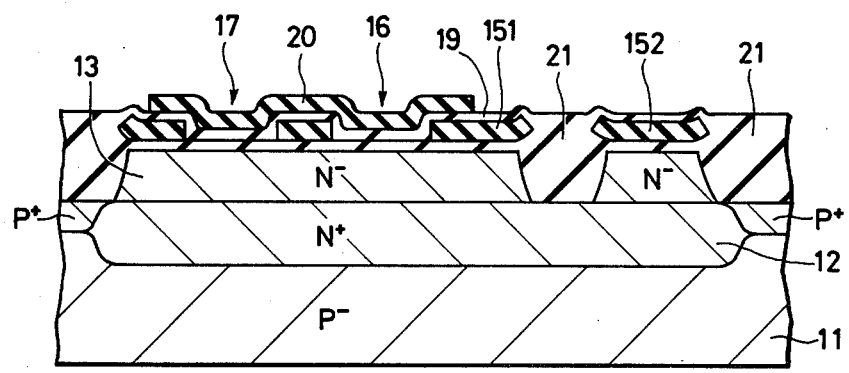

P-type impurities for forming a channel stopper are then ion-implanted into the section 18, on which a field oxide film is to be formed, in order to isolate the islands (the active regions) dielectrically. The resulting product is then oxidized at a high pressure (for example, 3–5 atmospheres), or at normal pressure but high temperature and humidity (1000° C., humid atmosphere) by utilizing as masks the first oxidation impermeable film areas 151, 152 and the second oxidation impermeable film 20 as shown in FIG. 2D, to form a field oxide film 21 having a thickness of about 1–2 μm and reaching the N+ type buried layer 12 on the sections 18, 18a. The field oxide film 21 is not formed over the section 16 which will be the emitter region and the base electrode contact section 17 because these sections are covered with the second oxidation impermeable film 20. In other words, the field oxide film 21 is formed only in the regions between the masking areas 151, 152 of the first oxidation impermeable film. Namely, the first oxidation impermeable film defines the portions of the field oxide film 21 constituting the dielectric isolating regions while the second oxidation impermeable film prevents the surface of the N− type silicon layer 13 in the section 16, which will be the emitter region, and the base electrode contact section 17 from being oxidized.

Figure 2E:
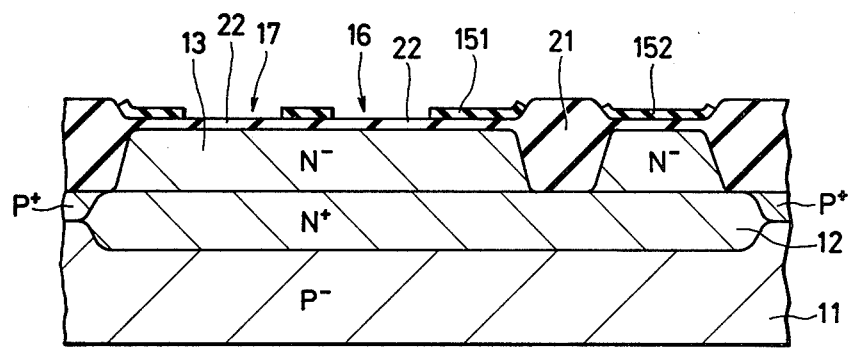

The nitride film 20 constituting the second oxidation impermeable film is then etched with hot phosphoric acid to remove it. The nitride film areas 151, 152 constituting the first oxidation impermeable films are not etched due to the existence of the $SiO_2$ film 19. The whole of the $SiO_2$ film 19 is thereafter etched with an etching liquid of fluoric acid, and then the $SiO_2$ film 14 is etched by utilizing the exposed $Si_3N_4$ film as a mask. As a result, the N− type silicon layer 13 in the section 16 which will become the emitter region and the base electrode contact section 17 is exposed. The surfaces of this N− type silicon layer are thereafter oxidized again to form a thin $SiO_2$ film 22 as shown in FIG. 2E.

Figure 2F:
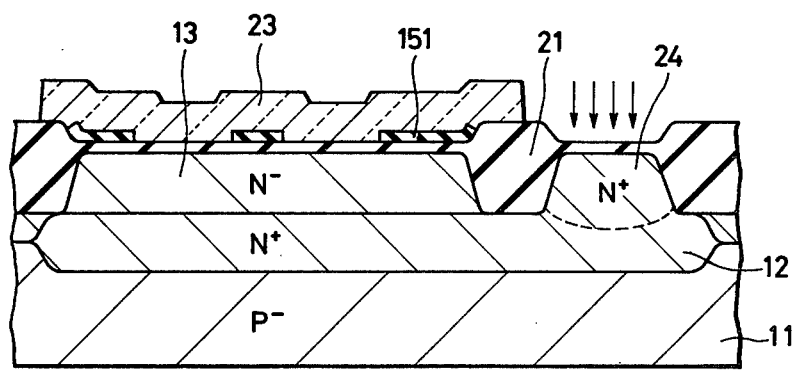

The base side is then covered with a mask 23 of photoresist as shown in FIG. 2F, and the $Si_3N_4$ area 152 on the collector side is removed by a dry etching method. N-type impurities, for example, phosphorus ions, are then implanted, and the resultant product is subjected to an annealing treatment to form a N+ type layer 24 for a collector electrode leadout section.

Figure 2G:
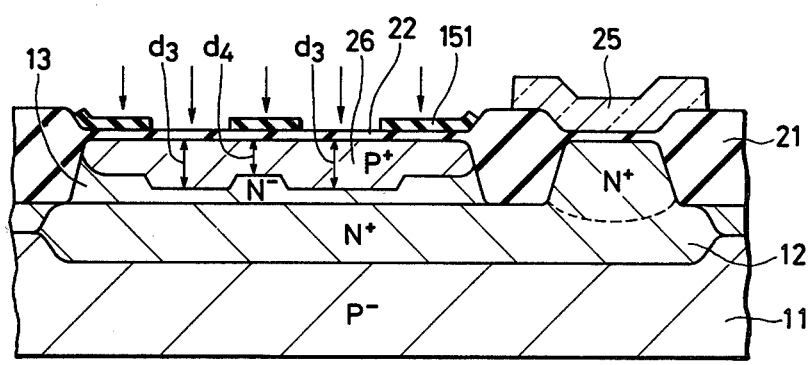

The photoresist film 23 is then removed, and the collector side is covered with a mask, for example, a photoresist film 25, as shown in FIG. 2G. P-type impurities, for example, boron ions, are implanted in the base side through the $SiO_2$ film 22 and $Si_3N_4$ area 151 with an implantation energy of 30–50 KeV and an impurity concentration of $1 \times 10^{14}$ to $4 \times 10^{14}$ atoms/cm². Since boron ions easily permeate through the $Si_3N_4$ film, an implantation energy of as low as 30–50 KeV is sufficient. The resultant product is annealed at 950°–1000° C. for 40–60 minutes to form a P+ type base region 26. The depth $d_4$ of the parts of the P+ base region 26 which are covered by the $Si_3N_4$ area 151 is as little as 0.2–0.4 μm, and the depth $d_3$ of the parts of the P+ base region 26 which are not covered by the Si$_3$N$_4$ film is as much as 0.4–0.6 μm.

Figure 2H:
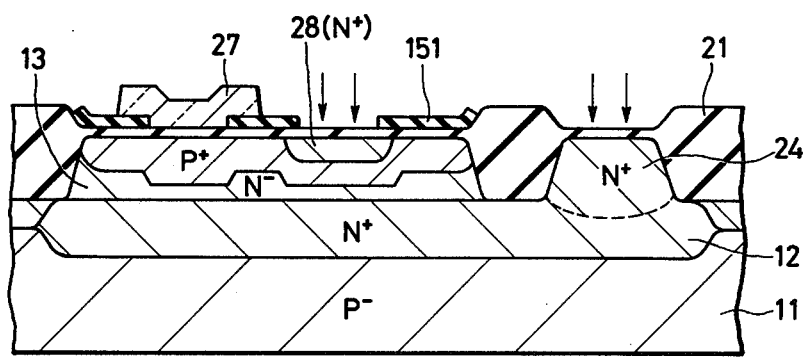
Figure 21:
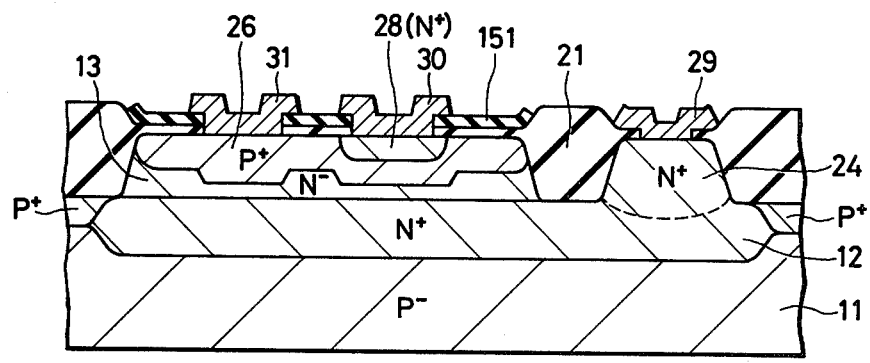

The photoresist film 25 is then removed, and N-type impurities, for example, arsenic ions, are implanted with the base electrode contact section covered with a mask, for example, a photoresist film 27 as shown in FIG. 2H, with an implantation energy of 50 KeV and an impurity concentration of 5×10$^{15}$ atoms/cm$^2$. Since arsenic ions do not permeate easily through the Si$_3$N$_4$ film, they do not reach the substrate in the areas of the semiconductor wafer which are covered by Si$_3$N$_4$ film, even when the implantation energy used is 50 KeV. This ensures that the emitter region 28 is defined by the Si$_3$N$_4$ area 151 constituting the first mask. The resultant product is annealed at 950°–1000° C. to form a N+ type emitter region 28. The depth of the N+ type emitter region 28 is around 0.2–0.4 μm. At the same time that the emitter region is formed, N+ type impurities are introduced into the collector electrode lead-out section 24.

The photoresist film 27 is then removed, and the exposed SiO$_2$ films 14, 22 are removed by lightly washing the whole surface thereof. Aluminum is then deposited on the resultant product by evaporation, the aluminum layer thus formed being patterned with photoresist to form a base electrode 31, an emitter electrode 30 and a collector electrode 29.

According to the present invention described above, the formation of a walled emitter structure, which causes short-circuiting between collector and emitter, can be completely prevented, and the degree of integration of the ICs can be increased. This is due to the fact that both the field oxide film 21 and emitter region 28 are defined by the patterns 151, 152 of a single mask; i.e., the Si$_3$N$_4$ film constituting the first oxidation impermeable film. Unlike conventional methods of this kind in which the field oxide film 21 and emitter region 28 are defined by two separate masks, the method according to the present invention automatically avoids any mask-alignment errors. The distance between the field oxide film 21 and the emitter region 28 is substantially equal to the distance d$_2$ defined by the pattern of the Si$_3$N$_4$ film. Accordingly, a walled emitter structure is not formed, so that short-circuiting between an emitter and a collector can be completely prevented.

According to the present invention, it is unnecessary to allow a mask-alignment margin. Therefore, in a semiconductor integrated circuit device made by the method according to the present invention and having an emitter region, the area of which is equal to that in a conventional semiconductor integrated circuit device, the area of the base can be reduced by an amount corresponding to the area of the mask-aligning margin needed in the conventional device. The area of a single transistor element can be reduced by at leas thirty percent, so that the area of the IC, as a whole, can be reduced to a great extent.

The present invention also permits an increase in the speed of operation of an IC. This is ascribed to the area of the base, which is reduced to a great extent, as mentioned above, compared with that of a conventional IC. This causes a decrease in the junction capacitance between the P+ type base region 26 and N− type epitaxial layer 13; i.e., the base-collector capacitance.

The present invention is very advantageous for increasing the speed of operation of an IC, when the N− type epitaxial layer 13 generating a base-collector capacitance has a concentration gradient due to upward diffusion from the N+ type buried layer 12.

Figure 4:
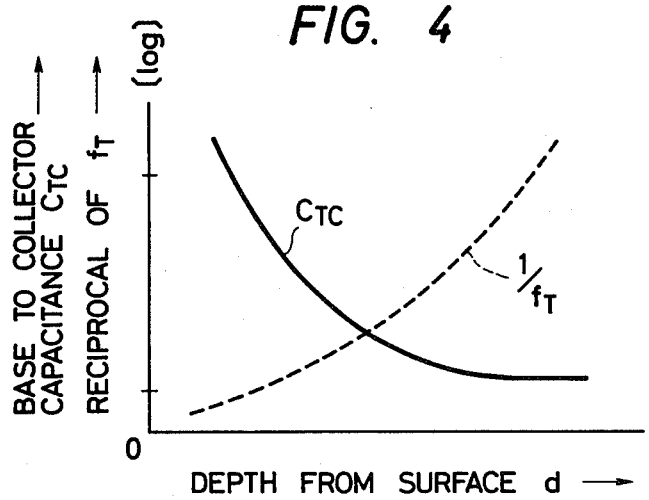
FIG. 4 is a graph showing the relationship between the depth of a base-collector junction of a transistor and the capacitance and high-pass cut-off frequency of the base-collector junction.

In general, the lower the collector concentration at a base-collector junction surface is, the more the base-collector capacitance C$_{TC}$ can be reduced. However, the cut-off frequency f$_T$ (the frequency when the common emitter current gain β becomes 1) of the transistor is also reduced with a decrease in the base-collector capacitance. Accordingly, when the epitaxial layer forming a base-collector junction has impurities, the concentration of which increases in proportion to the depth of the epitaxial layer, the relationship between the depth of the epitaxial layer and the base collector capacitance C$_{TC}$ and the cut-off frequency f$_T$ is as shown in full and broken lines, respectively, in FIG. 4. Therefore, when the depth of the base region as a whole is set, as in a conventional IC, to be substantially equal to that of the part thereof which is under the emitter region and works as an effective base, an increase in the operational speed based on the reduction of the parasitic capacitance and an increase in the cut-off frequency f$_T$ based thereon, which contradict each other, cannot be attained simultaneously.

Figure 5:
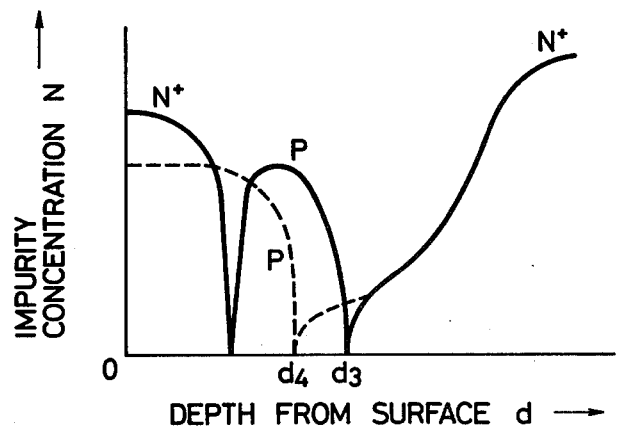
FIG. 5 is a graph showing the distribution of the concentration of impurities in the transistor.

On the other hand, the depth d$_3$ of the diffusion in the parts of the base region in the present invention which are under the emitter region 28 is greater than the depth d$_4$ of the diffusion in the other greater parts thereof as illustrated in FIG. 2G. The distribution of the concentration of impurities from the surface of the substrate to the upper surface of the base region in the parts thereof which have these depths d$_3$, d$_4$ is shown in FIG. 5. As can be understood from the graph, the concentration of collector impurities in the part of the base-collector junction which has the depth d$_4$ is lower than that in the part thereof which has the depth d$_3$.

As described above, the concentration of impurities in the parts of the collector region in the base-collector junction which are just under the emitter region and which work as an effective base is high, so that a high voltage value of f$_T$ can be obtained. On the other hand, the base-collector capacitance of the base region, as a whole, can be reduced since the junction depth of the greater part of the base region is small and since the concentration of impurities in the junction part of the collector region is low. This allows the speed of operation of a resulting IC to be increased.

According to the present invention, the following effects can be obtained in addition to the above-described effects:

(1) The dense Si$_3$N film 15 formed at a high temperature can be used as a passivation film.

(2) The step of forming a contact hole to bring the base electrode 31 into contact with the base region 26 can be omitted.

Figure 6:
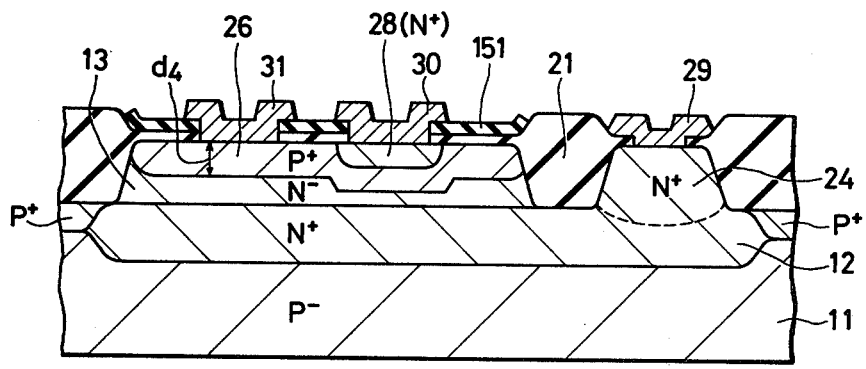
FIG. 6 is a sectional view illustrating another embodiment of the present invention.

The semiconductor integrated circuit device according to the present invention can be modified in various ways. An example of a modification or different embodiment of the device is shown in FIG. 6. In this example, the shape of the Si$_3$N$_4$ film area 151 constituting the first mask in the first embodiment is changed. FIG. 6 is a sectional view of an element structure obtained by patterning the Si$_3$N$_4$ film area 151 during the step shown in FIG. 2B so as to cover the base electrode contact section as well.

In this embodiment, the depth of the part of the base-collector junction which is under the base electrode is equal to the depth d$_4$ of a thinner part of the same junction since the ion-implantation forming the base region is carried out through the Si$_3$N$_4$ film. Therefore, when the N− type epitaxial layer 13 constituting the base-collector junction has such a distribution of concentration of impurities as shown in FIG. 5, the base-collector capacitance can be reduced even more than in the first embodiment. This allows the speed of operation of the IC to be increased advantageously. The process for fabricating this embodiment is substantially the same as that shown in FIGS. 2A–2I for fabricating the first embodiment except that a step of forming a contact hole, which is used to bring the base electrode 31 into contact with the base region 26, in the $Si_3N_4$ area 151 after the emitter region 28 has been formed is also needed. Since the step of forming the photoresist film 27 shown in FIG. 2H is not needed in this example, the extra step of forming a contact hole does not cause any great increase in the time required for carrying out the whole process. According to these embodiments, the same effects can be obtained as in the first embodiment, though the former differs a little from the latter in the above point.

The present invention is not limited to the above embodiments. It can also be applied to, for example, $I^2Ls$ using an oxide film isolation method.

What is claimed is:

1. A method of fabricating semiconductor integrated circuit devices, comrising the steps of preparing a semiconductor body having a main surface; forming a first mask of an oxidation impermeable material over said main surface, said first mask covering selected areas of said main surface and exposing a first area of said main surface, at which an isolating region is to be formed, and at least one second area of said main surface, which is surrounded by and spaced apart from said first area; forming a second mask of an oxidation impermeable material to cover said second area exposed by said first mask and to expose said first area; oxidizing said semiconductor body having said first and second masks to form an oxide film extending into said semiconductor body in said first area not covered by said masks; removing said second mask from said main surface; and introducing impurities into said semiconductor body from said first mask through said second area to form a semiconductor region.

2. A method of fabricating semiconductor integrated circuit devices according to claim 1, wherein said oxidation impermeable material forming said first and second masks is silicon nitride.

3. A method of fabricating semiconductor integrated circuit devices according to claim 1, wherein said semiconductor region is an emitter region.

4. A method of fabricating semiconductor integrated circuit devices according to claim 3, wherein said second mask has an opening, which is made to expose a third area of said main surface, and which is used to define a base-contact region.

* * * * *